United States Patent
Krishnan et al.

(10) Patent No.: US 8,865,017 B2
(45) Date of Patent: Oct. 21, 2014

(54) SILICON SURFACE TEXTURING METHOD FOR REDUCING SURFACE REFLECTANCE

(71) Applicant: International Business Machines Corporation, Armonk, NY (US)

(72) Inventors: Mahadevaiyer Krishnan, Hopewell Junction, NY (US); Jun Liu, Irvington, NY (US); Satyavolu S. Papa Rao, Poughkeepsie, NY (US); George G. Totir, Newtown, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/060,107

(22) Filed: Oct. 22, 2013

(65) Prior Publication Data

US 2014/0042360 A1    Feb. 13, 2014

Related U.S. Application Data

(62) Division of application No. 13/165,339, filed on Jun. 21, 2011.

(51) Int. Cl.
| | |
|---|---|
| *C09K 13/02* | (2006.01) |
| *H01L 31/18* | (2006.01) |
| *H01L 31/0236* | (2006.01) |
| *H01L 31/0384* | (2006.01) |
| *B82Y 30/00* | (2011.01) |

(52) U.S. Cl.
CPC ........ *H01L 31/03845* (2013.01); *H01L 31/186* (2013.01); *H01L 31/02363* (2013.01); *C09K 13/02* (2013.01); *Y02E 10/547* (2013.01); *B82Y 30/00* (2013.01); *H01L 31/1804* (2013.01)
USPC .............................. 252/79.1; 252/79.5; 438/71

(58) Field of Classification Search
USPC .......................... 252/79.1, 79.5; 438/71, 693
See application file for complete search history.

(56) References Cited

U.S. PATENT DOCUMENTS

| | | | |
|---|---|---|---|
| 6,197,611 B1 | 3/2001 | Nishimoto | |
| 7,446,051 B2 | 11/2008 | Young | |
| 7,494,936 B2 | 2/2009 | Ein-Eli et al. | |
| 7,828,983 B2 | 11/2010 | Weber et al. | |
| 7,858,426 B2* | 12/2010 | Cheong et al. | 438/57 |
| 2008/0124930 A1* | 5/2008 | Lim et al. | 438/692 |
| 2009/0014415 A1* | 1/2009 | Chelle et al. | 216/53 |

OTHER PUBLICATIONS

Mayer, K. et al., "New Surfactants for combined cleaning and texturing of mono-crystalline silicon wafers after wire-sawing", 23rd European Photovoltaic Solar Energy Conference and Exhibition, Sep. 1-5, 2008.

Fisher, K., et al., "Investigation of Low Molarity Alkaline Texturing Solutions", Proceedings of the 15th International Photovoltaic Science & Engineering Conference (PVSEC-15) Published :Oct. 1, 2005.

* cited by examiner

*Primary Examiner* — Alexander Ghyka

(74) *Attorney, Agent, or Firm* — Scully, Scott, Murphy & Presser, P.C.; Louis J. Percello

(57) ABSTRACT

A method of texturing a surface of a crystalline silicon substrate is provided. The method includes immersing a crystalline silicon substrate into an aqueous alkaline etchant solution to form a pyramid shaped textured surface, with (111) faces exposed, on the crystalline silicon substrate. The aqueous alkaline etchant solution employed in the method of the present disclosure includes an alkaline component and a nanoparticle slurry component. Specifically, the aqueous alkaline etchant solution of the present disclosure includes 0.5 weight percent to 5 weight percent of an alkaline component and from 0.1 weight percent to 5 weight percent of a nanoparticle slurry on a dry basis.

9 Claims, 3 Drawing Sheets

SILICON SURFACE TEXTURING METHOD FOR REDUCING SURFACE REFLECTANCE

CROSS REFERENCE TO RELATED APPLICATION

This application is a divisional of U.S. patent application Ser. No. 13/165,339, filed Jun. 21, 2011 the entire content and disclosure of which is incorporated herein by reference.

BACKGROUND

The present disclosure relates to crystalline silicon solar cell manufacturing, and more particularly, to a method for texturing a crystalline silicon substrate utilizing an aqueous alkaline etchant solution which includes a nanoparticle slurry as one of the components thereof.

A photovoltaic device is a device that converts the energy of incident photons to electromotive force (e.m.f.). Typical photovoltaic devices include solar cells, which are configured to convert the energy in the electromagnetic radiation from the Sun to electric energy.

In a typical solar cell, single-crystalline silicon is generally used as one of the components of the cell. In such applications, the single-crystalline silicon needs to have a non-planar surface to improve light capture. Typically, the non-planar surface has concave and convex patterns with a minute pyramid (i.e., square pyramid) shape. In such solar cells, the light reflected from one spot impinges again to another spot on the surface of the crystalline solar cell by virtue of the 'textured' surface, penetrating into the solar cell to be effectively absorbed in the solar cell. Although a portion of the impinging light that has not been fully absorbed, but arrives at the back face of the solar cell, is reflected back to the surface again, that portion of impinging light can be reflected again at the surface comprising steeply inclined pyramidal surfaces, thereby confining the light in the solar cell to improve absorption of light and to enhance power generation.

In conventional single-crystalline silicon solar cells, the textured structure is formed by immersing the exposed (100) face of a single-crystalline silicon wafer into an alkaline solution, i.e., sodium hydroxide (NaOH) or potassium hydroxide (KOH), which may also include 5 to 30% by volume of isopropyl alcohol and/or 0.3 to 1.5% by weight of silicon. The silicon is etched into the bath as a bath conditioner.

The etching rate in anisotropic etchants of the kind described above depends on the crystallographic orientation of the silicon surface being etched. The etching rate on the (111) face is significantly lower than the other crystallographic orientations. Accordingly, the (111) face with the slowest etching rate is advantageously left on the surface. Since this (111) face is inclined by about 54 degree against the (100) face, pyramidal projections constituted of the (111) face and its equivalent faces are formed. The pyramid size and density depends on the KOH or NaOH concentration, the amount of silicon already dissolved in the bath, and additive such as isopropyl alcohol.

SUMMARY

In one embodiment, an aqueous alkaline etchant solution is provided that can be used to texture a surface of a crystalline silicon substrate. In this embodiment, the aqueous alkaline etchant solution includes 0.5 weight percent to 5 weight percent of an alkaline component and from 0.1 weight percent to 5 weight percent of a nanoparticle slurry. No alcohol, surfactant, or pre-etched conditioning silicon is necessary to achieve complete pyramid coverage and low reflectance in the present disclosure.

In another embodiment, a method of texturing a surface of a crystalline silicon substrate is provided. Specifically, the method of the present disclosure includes immersing a crystalline silicon substrate into an aqueous alkaline etchant solution to form a pyramid shaped textured surface, with (111) faces exposed, on the crystalline silicon substrate. The aqueous alkaline etchant solution employed in the method of the present disclosure includes an alkaline component and a nanoparticle slurry. Again, no alcohol, surfactant, or pre-etched conditioning silicon is necessary to achieve complete pyramid coverage and low reflectance in the present disclosure.

When the aqueous alkaline etchant solution of the present disclosure is used to texture a crystalline silicon surface, the aqueous alkaline solution provides a substantially improved textured crystalline Si surface, with an increased density of smaller-sized pyramids compared to a KOH-only process. The improved morphology of the textured surface that is achieved by utilizing the aqueous alkaline etchant solution of the present disclosure leads to a significant decrease in the measured reflectance.

DETAILED DESCRIPTION

Figure 1:
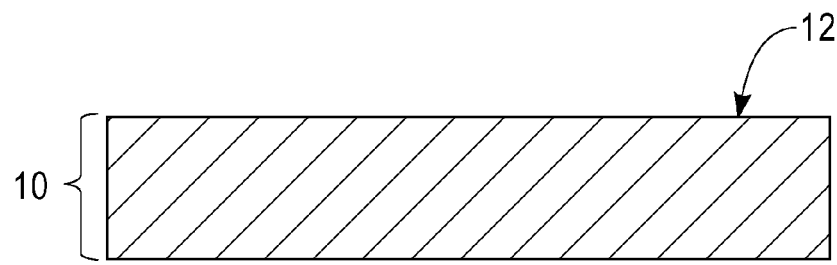
FIG. 1 is a pictorial representation (through a cross sectional view) illustrating a crystalline silicon substrate that can be employed in one embodiment of the present disclosure.

The present disclosure, which provides a method of texturing a crystalline silicon surface using an aqueous alkaline etchant solution including a nanoparticle slurry, will now be described in greater detail by referring to the following discussion and drawings that accompany the present application. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Texturing of silicon surfaces is one of the necessary first steps in the fabrication of crystalline Si-based solar cells to achieve minimal wafer reflectance and increased light absorption. The present disclosure provides a wet texturing method that generates crystalline Si wafer surfaces with complete pyramid coverage and improved reflectance response, significantly lower reflectance than those processed in a KOH-only solution and comparable, if not lower, to those processed in a KOH/IPA or a KOH/Si mixture solution. In addition, the method of the present disclosure employs a stable chemistry with no flammable component.

The method of the present disclosure utilizes an aqueous alkaline etchant solution including a nanoparticle slurry as one of the components of the etchant solution to texture a surface of a crystalline silicon substrate. The use of the aqueous alkaline etchant solution of the present disclosure provides a substantially improved textured crystalline silicon surface, with an increased density of smaller-sized pyramids compared to a KOH-only process. The improved morphology of the textured surface that is achieved by the present disclosure leads to a significant improvement in the measured reflectance. For example, based on measurements performed by the applicants of the present disclosure, a crystalline Si surface textured with a KOH-only bath is twice as reflective as a similar surface textured by the method of the present disclosure.

Figure 2:
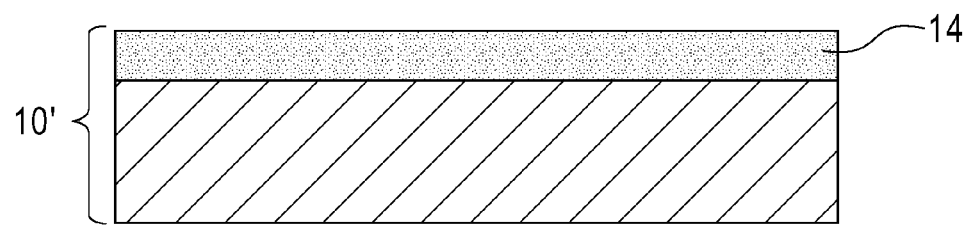
FIG. 2 is a pictorial representation (through a cross sectional view) illustrating the structure shown in FIG. 1 after immersing the single-crystalline silicon substrate in an etchant solution in accordance with the present disclosure.

Reference is now made to FIGS. 1-2 which illustrate a crystalline silicon substrate prior to etching and after etching using an etchant solution in accordance with the present disclosure. Specifically, FIG. 1 illustrates a crystalline silicon substrate 10 which has an exposed (100) oriented surface, i.e., face, 12. In one embodiment the crystalline silicon substrate 10 comprises single-crystalline silicon. The terms "single-crystalline or mono-crystalline silicon" denotes any silicon substrate in which the crystal lattice of the entire substrate is continuous and unbroken to the edges of the substrate, with no grain boundaries.

When single-crystalline silicon is employed as crystalline silicon substrate 10, the single-crystalline silicon can be fabricated using methods that are well known in the art. In one embodiment, the single-crystalline silicon can be formed by Czocharalski or other techniques using directional solidification. In another embodiment, the single-crystalline silicon can be a thin film that is grown on top of a substrate (for example, by epitaxial techniques).

In some embodiments, the crystalline silicon substrate 10 is non-doped. In other embodiments, the crystalline silicon substrate 10 is doped with either a p-type dopant or an n-type dopant. As used throughout the present application, "p-type" refers to the addition of impurities to an intrinsic semiconductor that creates deficiencies of valence electrons. Examples of p-type dopants, i.e., impurities, that can be present in crystalline silicon substrate 10 include, but are not limited to, boron, aluminum, gallium and indium. In one embodiment in which the crystalline silicon substrate 10 includes p-type dopant, the p-type dopant is present in a concentration ranging from $1\times10^9$ atoms/cm$^3$ to $1\times10^{20}$ atoms/cm$^3$. In another embodiment in which the crystalline silicon substrate 10 includes a p-type dopant, the p-type dopant is present in a concentration ranging from $1\times10^{14}$ atoms/cm$^3$ to $1\times10^{19}$ atoms/cm$^3$. As used throughout the present application, "n-type" refers to the addition of impurities that contributes free electrons to an intrinsic semiconductor. Examples of n-type dopants, i.e., impurities, that can be present in the crystalline silicon substrate 10 include, but are not limited to, antimony, arsenic and phosphorous. In one embodiment in which the crystalline silicon substrate 10 includes an n-type dopant, the n-type dopant is present in a concentration ranging from $1\times10^9$ atoms/cm$^3$ to $1\times10^{20}$ atoms/cm$^3$. In another embodiment in which the crystalline silicon substrate 10 includes an n-type dopant, the n-type dopant is present in a concentration ranging from $1\times10^{14}$ atoms/cm$^3$ to $1\times10^{19}$ atoms/cm$^3$.

In one embodiment, the crystalline silicon substrate 10 of FIG. 1 can be an element of any photovoltaic device, such as, for example, an element of solar cell. In the case of solar cell applications, the crystalline silicon substrate 10 needs to have a non-planar surface to improve light capture within the crystalline silicon substrate 10.

After providing the crystalline silicon substrate 10, the crystalline silicon substrate 10 is textured by immersing the same in an etchant solution of the present application to form a pyramid shaped textured surface. FIG. 2 illustrates the resultant structure of FIG. 1 after texturing the crystalline silicon substrate 10. In FIG. 2, reference numeral 10' denotes the etched crystalline silicon substrate, and reference numeral 14 denotes the pyramid shaped textured surface that is a result of the immersing. The textured surface of the crystalline silicon substrate has (111) faces that are now exposed.

The etchant solution employed in the present disclosure is an aqueous alkaline etchant solution that includes potassium hydroxide (KOH), sodium hydroxide (NaOH), choline hydroxide, tetramethylammonium hydroxide (TMAH) or tetraethylammonium hydroxide (TEAH) as an alkaline component. In one embodiment, the alkaline component is present in the aqueous alkaline etchant solution of the present disclosure in a concentration of from 0.5 weight percent to 5 weight percent. In another embodiment, the alkaline component is present in the aqueous alkaline etchant solution of the present disclosure in a concentration of from 1 weight percent to 3 weight percent.

The aqueous alkaline etchant solution of the present disclosure also includes a nanoparticle slurry. The term "nanoparticle slurry" as used throughout the present disclosure denotes a suspension of colloidal particles in an aqueous solution. The colloidal particles that can be present in the nanoparticle slurry include, but are not limited to, at least one of alumina, silica, ceria, berylia, magnesia, zirconia and titania. In one embodiment, the colloidal particles are silica particles.

In one embodiment, the colloidal particles that are present in the nanoparticle slurry have a particle size from 10 nm to 1000 nm. In another embodiment, the colloidal particles that are present in the nanoparticle slurry have a particles size from 30 nm to 200 nm. Other particle sizes can also be used so long as the particle size of the colloidal particle is below 2500 nm.

In one embodiment, the concentration of the nanoparticle slurry in the aqueous alkaline etchant solution itself, calculated on a dry basis, is from 0.1 weight percent to 5 weight percent. In another embodiment, the concentration of the nanoparticle slurry in the aqueous alkaline etchant solution itself, calculated on a dry basis, is from 0.3 weight percent to 1.5 weight percent.

In addition to containing an alkaline component and a nanoparticle slurry, the aqueous alkaline etchant solution of the present disclosure may also contain, as an additive, an alcohol; the alcohol additive represents an optional component of the aqueous alkaline etchant solution of the present disclosure. In one embodiment, the alcohol that can be optionally present in the aqueous alkaline etchant solution of the present disclosure comprises isopropyl alcohol. In another embodiment, the alcohol that can be optionally present in the aqueous alkaline etchant solution of the present disclosure comprises glycerol. In yet another embodiment, the alcohol that can be optionally present in the aqueous alkaline etchant solution of the present disclosure comprises ethylene glycol. In addition to the aforementioned alcohols, other alcohols including from 2 to 12 carbon atoms which are straight-chained, branched or cyclic can also be used. For example, cyclohexanol and ethyl hexanol can also be employed as an additive of the aqueous alkaline etchant solution of the present disclosure.

In one embodiment in which an alcohol is present as an additive, the alcohol is present in the aqueous alkaline etchant solution in a concentration of from 0.1 weight percent to 20 weight percent. In another embodiment in which an alcohol is present as an additive, the alcohol is present in the aqueous alkaline etchant solution in a concentration of from 0.2 weight percent to 10 weight percent.

The aqueous alkaline etchant solution may also include a surfactant. The surfactant can optionally be co-used with the alcohol mentioned above, or it can be used by itself, i.e., without any alcohol. The surfactant that can be used in the present disclosure may include ionic (anionic and cationic) surfactants, zwitterionic surfactants, and/or nonionic surfactants.

Examples of anionic surfactants include, but are not limited to, sulfates such as alkyl sulfates (e.g., ammonium lauryl sulfate and sodium lauryl sulfate), alkyl ether sulfates (e.g., sodium laureth sulfate and sodium myeth sulfate), sulfonates (e.g., dioctyl sodium sulfosuccinate), sulfonate fluorosurfactants (e.g., perfluorooctanesulfonate and perfluorobutanesulfonate), alkyl benzene sulfonates, phosphates such as, for example, alkyl aryl ether phosphate and alkyl ether phosphate, carboxylates such as, for example, alkyl carboxylates (e.g., fatty acids salts and sodium stearate), and carboxylate fluorosurfactants such as, for example, perfluorononanoate and perfluorooctanoate.

Examples of cationic based surfactants include, but are not limited to, primary, secondary or tertiary amines, and quaternary ammonium compounds (e.g., alkyltrimethylammonium salts, cetylpyridinium chloride, polyethoxylated tallow amine, benzalkonium chloirde, nenzethonium chloride, dimethyldiocadecylammonium chloride, and dioctadecyldimethylammonium bromide).

Examples of zwitterionic surfactants include primary, secondary or tertairy amines, or quaternary ammonium cations with sulfonates (e.g., (3-[(3-Cholamidopropyl)dimethylammonio]-1-propanesulfonate) or sultaines), carboxylates (i.e., amino acids, imino acids and betaines) or phosphates (e.g., lecithin).

Examples of nonionic surfactants include fatty alcohols (e.g., cetyl alcohol, stearyl alcohol, cetostearyl alcohol and oleyl alcohol), polyoxyethylene glycol alkyl ethers (e.g., octaethylene glycol monododecyl ether and pantaethylene glycol monododecyl ether), polyoxypropylene glycol alkyl ethers, glucoside alkyl ethers (e.g., decyl glycoside, lauryl glucoside and octyl glucoside, polyoxyethylene glycol alkylphenol ethers, dodecyldimethylamine oxide, and block copolymers of polyethylene glycol and polypropylene glycol.

In some embodiments, ionic liquids, which are salts that are molten at room temperature, can be employed as the surfactant. Examples of ionic liquids that can be employed in the present disclosure include, but are not limited to, salts comprised of cationic species, such as imidazolium, phosphonium, and ammonium compounds, associated with anionic species, such as borate, halide, sulfate, acetate, phosphate, and sulfonate compounds.

In one embodiment in which a surfactant is present in the aqueous alkaline etchant solution of the present disclosure, the surfactant is present in the aqueous alkaline etchant solution in a concentration of from 0.00005 weight percent to 0.1 weight percent. In another embodiment in which a surfactant is present, the surfactant is present in the aqueous alkaline etchant solution of the present disclosure in a concentration of from 0.001 weight percent to 0.01 weight percent.

The aqueous alkaline etchant solution of the present disclosure may also include pre-etched conditioning silicon. In one embodiment, the pre-etched conditioning silicon may be used together with the alcohol and/or the surfactant mentioned above. In one embodiment, the pre-etched conditioning silicon is present in the aqueous alkaline etchant solution in an amount from 0.1 weight percent to 1.5 weight percent. In another embodiment of the present disclosure, the pre-etched conditioning silicon is present in the aqueous alkaline etchant solution in a concentration of from 0.5 weight percent to 1.0 weight percent.

In accordance with the present disclosure, the remainder of the aqueous alkaline etchant solution of the present disclosure is water (typically de-ionized water). As such, water is present in amount such that its sum with the alkaline component, the nanoparticle slurry, optional alcohol additive, optional surfactant, and optional pre-etched conditioning silicon adds up to 100%. In one embodiment, the alkaline component, the nanoparticle slurry, the optional alcohol additive, the optional surfactant, the optional pre-etched conditioning silicon, and water constituent the entirety of the etchant solution of the present disclosure.

The aqueous alkaline etchant solution can be formed by various methods. The above mentioned components can be added in different orders. For example and in one embodiment, the etchant solution can be prepared by first providing the alkaline component, admixing water to the concentration for the texturing process, then adding a nanoparticle slurry into the solution at an enhanced temperature, e.g., 70°-90° C., and thereafter admixing the optional alcohol additive and/or surfactant and/or pre-etched preconditioning silicon. In another embodiment, the etchant solution can be prepared by first providing the alkaline component, admixing a lower amount of water to a higher concentration than that needed for the texturing process, then adding the nanoparticle slurry into the solution at an enhanced temperature, e.g., 70°-90° C., and thereafter admixing more water to dilute to the desired concentration for the texturing process, and lastly admixing the optional alcohol additive and/or surfactant and/or pre-etched conditioned silicon. In yet another embodiment, water is first provided and then the alkaline and nanoparticle slurry can be added in any order, followed by optional alcohol additive and/or surfactant and/or pre-etched conditioning silicon. During the admixing step, stifling is typically employed.

In one example, the aqueous alkaline etchant solution can include a nanoparticle slurry comprising 30 weight percent of silica particles having a particle size of 50 nm mixed in dilute KOH, and optional alcohol additive and/or surfactant.

As stated above, the crystalline silicon substrate 10 is textured by immersing the same in the aqueous alkaline etchant solution of the present disclosure. In one embodiment, the immersing is performed at a temperature from 70° C. to 90° C. In another embodiment, the immersing is performed at a temperature from 75° C. to 85° C. The term "immersing" denotes that at least surface 12 of the crystalline silicon substrate 10 is placed into a bath that includes the aqueous alkaline etchant solution mentioned above.

In one embodiment, the duration of the immersing of the crystalline silicon substrate 10 into the aqueous etchant solution is from 10 minutes to 60 minutes. In another embodiment, the duration of the immersing of the crystalline silicon substrate 10 into the aqueous etchant solution is from 15 minutes to 30 minutes.

When the above conditions are employed for texturing a crystalline silicon substrate 10, the aqueous alkaline etchant solution of the present disclosure typically has an etch rate from 0.1 µm/min to 1.0 µm/min. More typically, the aqueous alkaline etchant solution of the present disclosure has an etch rate from 0.30 µm/min to 0.50 µm/min.

Additional texturing can be performed as deemed necessary by repeating the immersing step mentioned above.

In one embodiment of the present disclosure, the textured crystalline silicon substrate has a weighted average reflectance between 400 nm to 1100 nm of from 0.09 to 0.13. In another embodiment of the present disclosure, the textured crystalline silicon substrate has a weighted average reflectance between 400 nm to 1100 nm of from 0.10 to 0.12. The term "weighted average reflectance" is used throughout the present application to denote the average reflectance weighted to the photon flux density of an AM 1.5 G spectrum. The weighted average reflectance can be determined by reflectance spectroscopy.

As mentioned above the aqueous alkaline etchant solution of the present disclosure leads to a substantially improved textured crystalline Si surface, with an increased density of smaller-sized pyramids compared to a KOH-only process. By "improved textured crystalline Si surface" it is meant an increase of the surface area that is covered by pyramids. By "increased density" it is meant an increase of the number of pyramids in a unit area.

The improved morphology of the textured surface that is achieved by the present disclosure leads to a significant improvement in the measured reflectance. For example, a crystalline Si surface textured with a KOH-only bath is twice as reflective as a similar surface textured by the method of the present disclosure. In some embodiments, the total loss of Si that may occur using the method of the present disclosure may be significantly reduced compared to KOH-only texturing.

The following examples are provided to illustrate some embodiments of the present disclosure and to also illustrate some of the above mentioned advantages that can be achieved using the aqueous alkaline etchant solution of the present disclosure to texture a surface of a single-crystalline silicon substrate.

Example 1

Figure 3:
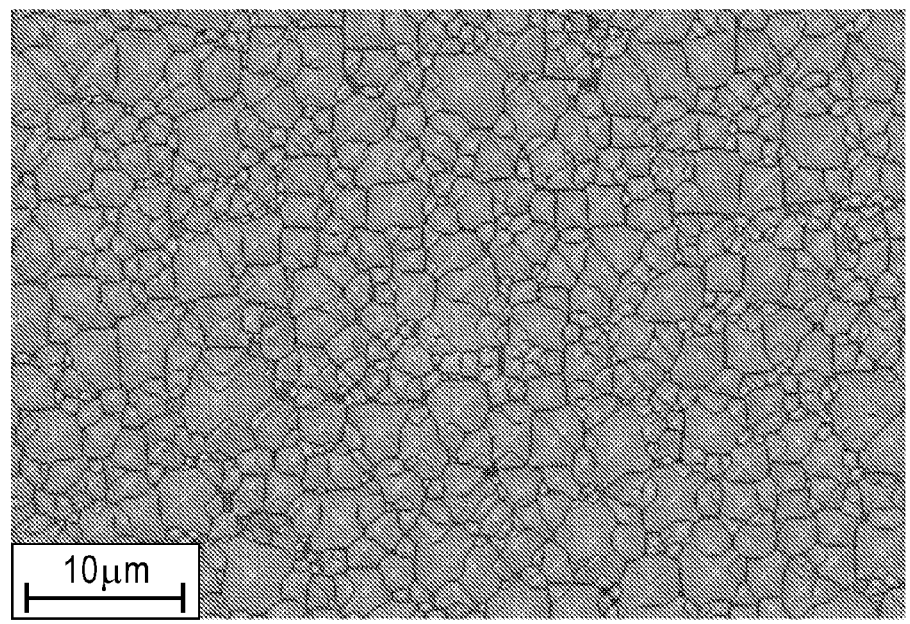
FIG. 3 is a scanning electron microscopic (SEM) photograph at a magnification of 2.00 K× showing the textured surface of a saw damaged etched (SDE) single-crystalline silicon substrate after immersing the same in an aqueous alkaline etchant solution including a nanoparticle slurry in accordance with Example 1 which represents an embodiment of the present disclosure.

In this example, which represents an embodiment of the present disclosure, a surface of a saw damaged etched (SDE) single-crystalline silicon substrate was textured by immersing the substrate in an aqueous alkaline etchant solution including a nanoparticle slurry. Specifically, the aqueous alkaline etchant solution employed in texturing the surface of the SDE single-crystalline silicon substrate of this example contained 1.5 weight % KOH and 1.2 weight % of a nanoparticle slurry containing 30 weight % of silica particles having a size of ~50 nm dispersed in water (0.4 weight % of silica particles on a dry basis in the aqueous alkaline etchant solution). The texturing was performed at 75° C., for 15 minutes. The etching rate was 0.41 µm/min, and the weighted average reflectance WAR was 0.112. FIG. 3 shows the actual SEM photograph of the textured SDE single-crystalline silicon wafer of this example.

Example 2

Figure 4:
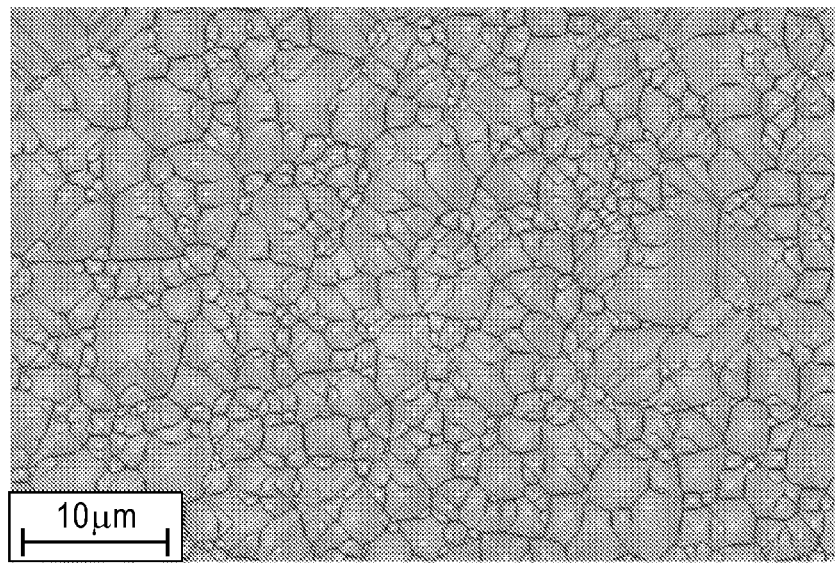
FIG. 4 is a scanning electron microscopic (SEM) photograph at a magnification of 2.00 K× showing the textured surface of an as-cut single-crystalline silicon substrate after immersing the same in an aqueous alkaline etchant solution including a nanoparticle slurry in accordance with Example 2 which represents another embodiment of the present disclosure.

In this example, which represents another embodiment of the present disclosure, a surface of an as-cut single-crystalline silicon substrate was textured by immersing the substrate in an aqueous alkaline etchant solution including a nanoparticle slurry. Specifically, the aqueous alkaline etchant solution employed in texturing the surface of the SDE single-crystalline silicon substrate of this example contained 1.5 weight % KOH and 1.2 weight % of a nanoparticle slurry containing 30 weight % of silica particles having a size of ~50 nm dispersed in water (0.4 weight % of silica particles on a dry basis in the aqueous alkaline etchant solution). The texturing was performed at 75° C., for 30 minutes. The etching rate was 0.45 µm/min, and the weighted average reflectance WAR was 0.114. FIG. 4 shows the actual SEM photograph of the textured SDE single-crystalline silicon wafer of this example.

Example 3

In this example, the weighted average reflectance of the textured single-crystalline silicon substrates of Examples 1 and 2 were compared with the weighted average reflectance of a non-textured as-cut single-crystalline silicon substrate and a non-textured saw damaged etched (SDE) single-crystalline silicon substrate. The results are summarized in Table 1.

TABLE 1

| Sample | Weighted Average Reflectance (WAR) |
| --- | --- |
| Non-textured As-Cut single-crystalline silicon substrate | 0.258 |
| Non-textured SDE single-crystalline silicon substrate | 0.397 |
| Textured single-crystalline silicon substrate of Example 1 | 0.112 |
| Textured single-crystalline silicon substrate of Example 1 | 0.114 |

The data shown in Table 1 illustrates that textured samples of the present disclosure all had a lower weighted average reflectance than non-textured samples.

Comparative Example 1

Figure 5:
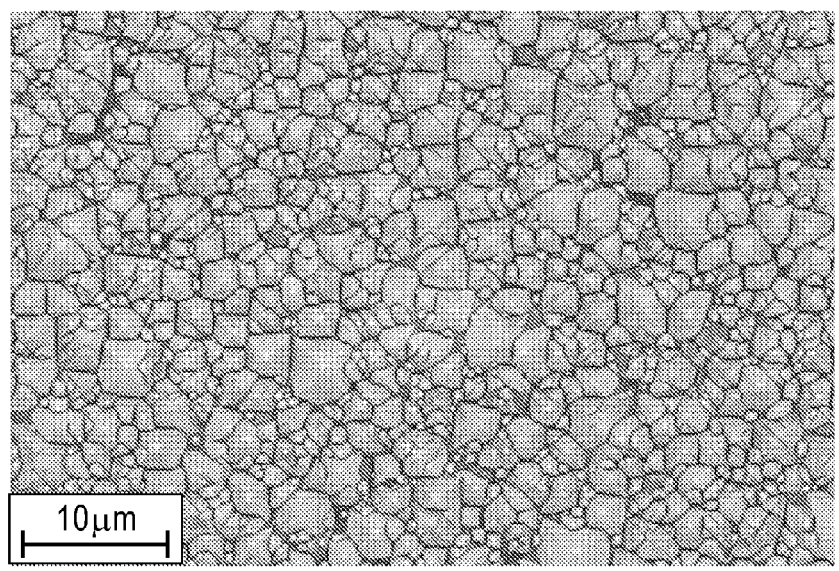
FIG. 5 is a scanning electron microscopic (SEM) photograph at a magnification of 2.00 K× showing the textured surface of an as-cut single-crystalline silicon substrate after immersing the same in a prior art aqueous alkaline etchant solution including KOH and silicon as described in Comparative Example 1.

In this comparative example, a surface of a saw damaged etched (SDE) single-crystalline silicon substrate was textured by immersing the substrate in a prior art aqueous alkaline etchant solution. Specifically, the aqueous alkaline etchant solution employed in texturing the surface of the SDE single-crystalline silicon substrate of this comparative example contained 1.5 weight % KOH and 0.5 weight % of a pre-etched conditioning silicon. The texturing was performed at 75° C., for 15 minutes. The etching rate was 0.28 μm/min, and the weighted average reflectance WAR was 0.117. FIG. 5 shows the actual SEM photograph of the textured SDE single-crystalline silicon wafer of this comparative example.

Comparative Example 2

Figure 6:
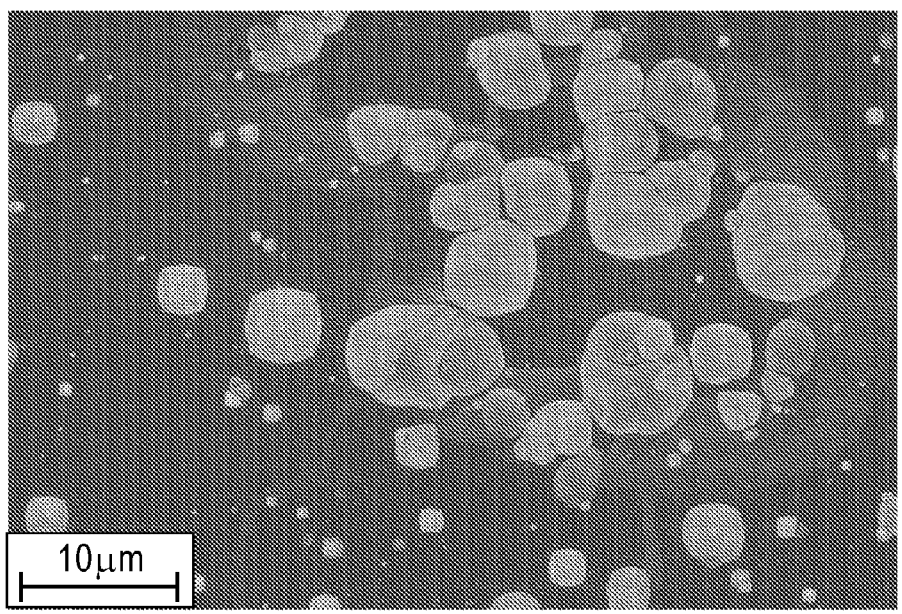
FIG. 6 is a scanning electron microscopic (SEM) photograph at a magnification of 2.00 K× showing the textured surface of an as-cut single-crystalline silicon substrate after immersing the same in a prior art aqueous alkaline etchant solution including only KOH with no Si or nanoparticle slurry as described in Comparative Example 2.

In this comparative example, a surface of a saw damaged etched (SDE) single-crystalline silicon substrate was textured by immersing the substrate in a prior art aqueous alkaline etchant solution. Specifically, the aqueous alkaline etchant solution employed in texturing the surface of the SDE single-crystalline silicon substrate of this comparative example contained 1.5 weight % KOH. The texturing was performed at 75° C., for 15 minutes. The etching rate was 0.73 μm/min, and the weighted average reflectance WAR was 0.268. FIG. 6 shows the actual SEM photograph of the textured SDE single-crystalline silicon wafer of this comparative example.

Example 4

In this example, the weighted average reflectance of the textured single-crystalline silicon substrate of Example 1 was compared with the weighted average reflectance of the textured single-crystalline silicon substrates of Comparative Examples 1 and 2. The results are summarized in Table 2.

TABLE 2

| Sample | Weighted Average Reflectance (WAR) |
| --- | --- |
| Textured single-crystalline silicon substrate of Example 1 | 0.112 |
| Textured single-crystalline silicon substrate of Comparative Example 1 | 0.117 |
| Textured single-crystalline silicon substrate of Comparative Example 1 | 0.268 |

The data shown in Table 2 illustrates that the textured sample of the present disclosure had a lower weighted average reflectance than the sample that was textured in a KOH-only solution, and a comparable, if not lower, reflectance to the sample that was textured in a silicon-conditioned KOH solution.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An aqueous alkaline etchant solution for texturing a surface of a crystalline silicon substrate, said aqueous alkaline etchant solution comprising 0.5 weight percent to 5 weight percent of an alkaline component, 0.1 weight percent to 5 weight percent of a nanoparticle slurry on a dry basis at least one alcohol and a surfactant, wherein said nanoparticle slurry consists of colloidal particles selected from the group consisting of alumina, ceria, berylia, magnesia, zirconia and titania.

2. The aqueous alkaline etchant solution of claim 1, wherein said at least one alcohol comprises isopropyl alcohol, ethylene glycol, glycerol, cyclohexanol or ethyl hexanol.

3. The aqueous alkaline etchant solution of claim 2, wherein said at least one alcohol is present in an amount from 0.1 weight percent to 20 weight percent.

4. The aqueous alkaline etchant solution of claim 1, wherein said surfactant comprises an ionic surfactant, a zwitterionic surfactant or a nonionic surfactant.

5. The aqueous alkaline etchant solution of claim 4, wherein said surfactant is present in said aqueous alkaline etchant solution in a concentration from 0.00005 weight percent to 0.1 weight percent.

6. The aqueous alkaline etchant solution of claim 1, wherein said alkaline component comprises potassium hydroxide (KOH), sodium hydroxide (NaOH), choline hydroxide, tetramethylammonium hydroxide (TMAH) or tetraethylammonium hydroxide (TEAH).

7. The aqueous alkaline etchant solution of claim 6, wherein said alkaline component is KOH.

8. The aqueous alkaline etchant solution of claim 1, wherein said colloidal particles have a size from 10 nm to 1000 nm.

9. The aqueous alkaline etchant solution of claim 1, wherein said nanoparticle slurry is present in an amount from 0.3 weight percent to 1.5 weight percent.

* * * * *